United States Patent
Adams

(10) Patent No.: US 12,359,310 B2
(45) Date of Patent: Jul. 15, 2025

(54) METHOD AND SYSTEM FOR COATING A METAL WORKPIECE WITH GRAPHENE

(71) Applicant: Ultra Conductive Copper Company, Inc., Lexington, MA (US)

(72) Inventor: Horst Jakob Adams, Houston, TX (US)

(73) Assignee: Ultra Conductive Copper Company, Inc., Lexington, MA (US)

( * ) Notice: Subject to any disclaimer, the term of this patent is extended or adjusted under 35 U.S.C. 154(b) by 70 days.

(21) Appl. No.: 17/858,331

(22) Filed: Jul. 6, 2022

(65) Prior Publication Data
US 2022/0333235 A1 Oct. 20, 2022

Related U.S. Application Data

(63) Continuation of application No. PCT/IB2020/050410, filed on Jan. 20, 2020.

(51) Int. Cl.
*C23C 16/26* (2006.01)
*C23C 16/02* (2006.01)
(Continued)

(52) U.S. Cl.
CPC .......... *C23C 16/26* (2013.01); *C23C 16/0209* (2013.01); *C23C 16/0227* (2013.01);
(Continued)

(58) Field of Classification Search
CPC ... C23C 16/26; C23C 16/209; C23C 16/0227; C23C 16/455; C23C 16/45557; C23C 16/458; C23C 16/52
(Continued)

(56) References Cited

U.S. PATENT DOCUMENTS

| | | | |
|---|---|---|---|
| 8,470,400 B2 * | 6/2013 | Colombo | B82Y 30/00 427/249.1 |
| 10,072,355 B2 * | 9/2018 | Colombo | C30B 29/02 |

(Continued)

FOREIGN PATENT DOCUMENTS

| | | |
|---|---|---|
| CN | 103952588 A | 7/2014 |
| CN | 109023291 A | 12/2018 |

(Continued)

OTHER PUBLICATIONS

Li et al., "Graphene Films with Large Domain Size by a Two-Step Chemical Vapor Deposition Process," *Nano Lett.*, 10(11): 4328-4334 (2010).

(Continued)

*Primary Examiner* — Brian K Talbot
(74) *Attorney, Agent, or Firm* — Leydig, Voit & Mayer, Ltd.

(57) ABSTRACT

A method for coating a metal workpiece with graphene includes exposing the metal workpiece to a carbon-containing precursor gas and a hydrogen gas in a processing chamber in a first phase, and to the carbon-containing precursor gas, the hydrogen gas and a first carrier gas in the processing chamber in a second phase after the first phase. A first flow rate of the carbon-containing precursor gas into the processing chamber is higher than a second flow rate of the carbon-containing precursor gas into the processing chamber, and a first flow rate of the hydrogen gas into the processing chamber is higher than a second flow rate of the hydrogen gas into the processing chamber. A first total gas pressure in the processing chamber in the first phase is lower than a second total gas pressure in the processing chamber in the second phase.

14 Claims, 6 Drawing Sheets

(51) Int. Cl.
*C23C 16/458* (2006.01)
*C23C 16/455* (2006.01)
*C23C 16/52* (2006.01)

(52) U.S. Cl.
CPC .......... *C23C 16/458* (2013.01); *C23C 16/455* (2013.01); *C23C 16/45557* (2013.01); *C23C 16/52* (2013.01)

(58) Field of Classification Search
USPC .............................. 427/249.1, 249.6, 255.28
See application file for complete search history.

(56) References Cited

U.S. PATENT DOCUMENTS

| | | | | |
|---|---|---|---|---|
| 10,233,566 | B2* | 3/2019 | List, III | C30B 25/14 |
| 10,253,428 | B2 | 4/2019 | Wu et al. | |
| 10,533,264 | B1* | 1/2020 | Sherrill | C30B 25/14 |
| 2012/0241069 | A1* | 9/2012 | Hofmann | C23C 16/04 |
| | | | | 977/734 |
| 2015/0050482 | A1* | 2/2015 | Ruoff | C30B 25/18 |
| | | | | 428/220 |
| 2015/0360954 | A1* | 12/2015 | Davis | H01L 21/02628 |
| | | | | 427/275 |
| 2015/0376778 | A1* | 12/2015 | Davis | H01L 21/02381 |
| | | | | 430/323 |
| 2016/0053398 | A1 | 2/2016 | Kurtz et al. | |
| 2016/0115032 | A1* | 4/2016 | Wodtke | C01B 32/188 |
| | | | | 205/291 |
| 2016/0332885 | A1* | 11/2016 | Sumant | C23C 16/52 |
| 2018/0102197 | A1 | 4/2018 | Adams | |
| 2019/0322532 | A1* | 10/2019 | Kim | C23C 16/01 |
| 2021/0163296 | A1* | 6/2021 | Nguyen | C01B 32/186 |

FOREIGN PATENT DOCUMENTS

| | | |
|---|---|---|
| WO | WO 2015/074752 A1 | 5/2015 |
| WO | WO 2015/090622 A1 | 6/2015 |
| WO | WO 2019/043497 A1 | 3/2019 |
| WO | WO 2019/043498 A1 | 3/2019 |
| WO | WO 2019/043499 A1 | 3/2019 |

OTHER PUBLICATIONS

European Patent Office, International Search Report and Written Opinion in International Patent Application No. PCT/IB2020/050410 (Oct. 2, 2020).

* cited by examiner

METHOD AND SYSTEM FOR COATING A METAL WORKPIECE WITH GRAPHENE

CROSS-REFERENCE TO RELATED APPLICATIONS

This patent application claims priority to International patent application No. PCT/IB2020/050410, filed on Jan. 20, 2020, which is incorporated herein in its entirety by reference.

FIELD OF THE DISCLOSURE

The present disclosure relates to techniques for coating a metal workpiece with graphene by means of chemical vapor deposition and, more particularly, techniques for protecting the workpiece, such as an electrical connector, against corrosion.

BACKGROUND OF THE INVENTION

Electrical connectors frequently need to operate in adverse conditions, including extreme heat, extreme cold, vibration, strain, snow, rain, moisture, or chemicals. These conditions may cause electrical connector corrosion and wires to disconnect, resulting in equipment downtime and high maintenance costs. Some industry reports suggest that up to 50 to 60% of the electrical downtime can be traced to open or intermittent connections.

Electrical connections therefore need to have mechanical properties and designs that securely maintain metal to metal contact so as to achieve a continued low electrical resistance throughout the life of the product, even under harsh field conditions. Engineers designing industrial control products must apply sound judgement in wire clamp design to ensure reliable long-term performance.

Metals used in wiring terminals generally have plating coatings for protection against corrosion and chemical attack. Protective coatings may be classified as "sacrificial coating" or "barrier layer coatings".

Sacrificial coatings are intended to be consumed during the corrosion process while providing a protective layer that prevents or substantially delays corrosion of the base metal. Once the sacrificial coating is consumed, the base metal will no longer have a protective layer and be at risk for corrosion.

Barrier layer coatings are intended to provide a protective seal to prevent corrosive and chemical attack. They are not consumed as part of the corrosion process. These coatings are effective unless they become porous or mechanically damaged. Examples of barrier layer coatings comprise top coats or sealers, nickel applied over brass, or tin applied over copper.

Copper is desirable for electrical connectors because of its low electrical resistance and capability to carry electrical current without generating excess heat. Oxide that forms on copper is typically copper oxide ($Cu_2O$), but other oxides may form as a result of environmental contaminants such as sulfides and chlorides. Oxides are typically poor electrical conductors and therefore significantly increase the resistance of the electrical connection. Increased electrical resistance can result in undesirable temperature rise for larger loads, or open circuits for smaller loads. Copper oxides can be identified on the copper surface by a darkening in color. Copper oxide is not a very stable compound and may therefore undergo further chemical reactions. A reaction with acid may result in the formation of copper hydroxide, which is of greenish color and frequently seen on copper surfaces.

Copper is often protected against oxides by means of a tin layer, which is a barrier type plating. Tin offers corrosion protection, especially from the oxidation due to air and sulfur compounds. However, the mechanical stability of the tin plating is limited, which can lead to connection problems, especially in connectors which are exposed to high mechanical stress and wear.

Graphene has been proposed as an anti-corrosion surface coating to limit or control cathodic current density on structural materials like fasteners, pins, attachment points, and interfaces. A graphene composite coating in which a single layer of graphene flakes is applied onto a metal surface by means of electrophoretic or electrolytic deposition is described in U.S. 2016/0053398 A1.

Coatings for steel strips that comprise zinc or a zinc alloy, graphene and a coupling agent comprising an organofunctional siloxane are disclosed in WO 2015/090622 A1 and WO 2015/074752 A1.

A graphene copper composite material in which graphene is uniformly dispersed in a copper matrix is disclosed in CN 103952588 A.

Graphene-copper composite structures with enhanced electric conductivity are disclosed in U.S. 2018/0102197 A1 and WO 2019/043498 A1. Manufacturing techniques for these structures are elucidated in additional detail in WO 2019/043497 A1 and WO 2019/043499 A1.

In view of the prior art, what is needed is an efficient and scalable technique for providing a metal workpiece with a coating that is mechanically stable and provides efficient corrosion protection.

BRIEF SUMMARY OF THE INVENTION

In a first aspect, the present disclosure relates to a method for coating a metal workpiece with graphene by means of chemical vapor deposition, comprising: exposing the metal workpiece to a carbon-containing precursor gas and a hydrogen gas in a processing chamber in a first phase; and exposing the metal workpiece to the carbon-containing precursor gas, the hydrogen gas and a first carrier gas in the processing chamber in a second phase after the first phase. A first flow rate of a flow of the carbon-containing precursor gas into the processing chamber in the first phase is higher than a second flow rate of a flow of the carbon-containing precursor gas into the processing chamber in the second phase. A first flow rate of a flow of the hydrogen gas into the processing chamber in the first phase is higher than a second flow rate of a flow of the hydrogen gas into the processing chamber in the second phase. A first total gas pressure in the processing chamber in the first phase is lower than a second total gas pressure in the processing chamber in the second phase.

BRIEF DESCRIPTION OF THE SEVERAL VIEWS OF THE DRAWING(S)

The techniques of the present disclosure and the advantages associated therewith may be best understood from a detailed description of embodiments with reference to the enclosed drawings.

FIG. 3b illustrates openings formed in the guiding plate shown in FIG. 3a.

DETAILED DESCRIPTION OF THE INVENTION

The techniques of the present disclosure will now be described with reference to an example application that involves the coating of thin copper foils with graphene. However, this is for illustration only, and one skilled in the art will understand that the techniques of the present disclosure may be employed to coat metal workpieces of widely different materials, sizes, and shapes.

Figure 1:
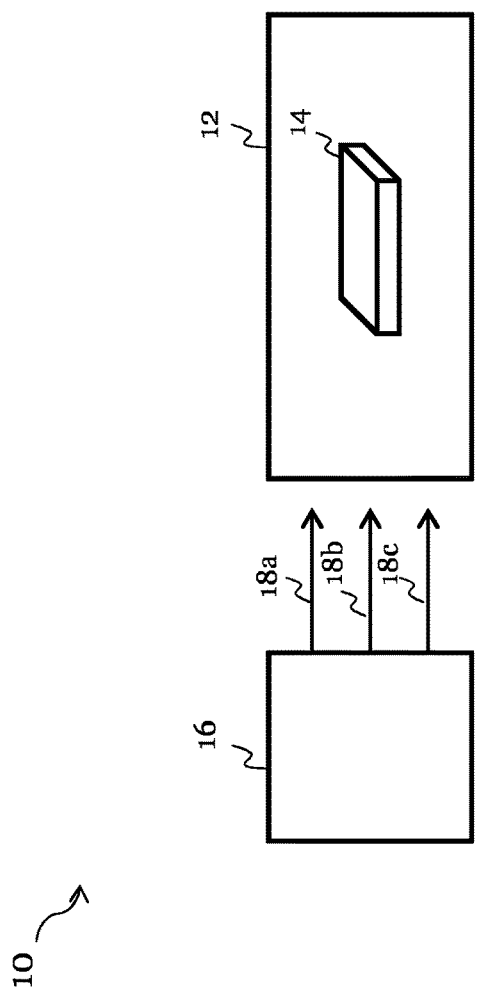
FIG. 1 is a schematic illustration of a system for coating a metal workpiece with graphene according to an embodiment of the present disclosure.

FIG. 1 is a schematic illustration of a system 10 for coating a metal workpiece with graphene by means of chemical vapor deposition (CVD), according to an embodiment.

The CVD coating system 10 comprises a processing chamber 12 in which a sample holder 14 is placed and adapted to hold a metal workpiece, such as a copper foil (not shown). For instance, the copper foil may have a length of 20 mm to 100 mm, a width of 20 mm to 300 mm, and a thickness of 5 μm to 1 mm, but other dimensions and geometries may likewise be employed.

In some embodiments, the processing chamber 12 may comprise a quartz tube, but other forms and geometries may likewise be employed.

As shown in FIG. 1, the CVD coating system 10 further comprises a gas supply unit 16 that is in fluid communication with the processing chamber 14 and is adapted to selectively supply a plurality of processing gases into the processing chamber 12 and towards the sample holder 14 at predetermined partial pressures or flow rates, such as via corresponding gas supply ducts 18a, 18b, 18c. The plurality of processing gases may be stored in corresponding reservoirs within the gas supply unit 16, or may be provided to the gas supply unit 16 from external reservoirs.

FIG. 1 shows a configuration with three gas supply ducts 18a, 18b, 18c corresponding to three different processing gases. However, this is for illustration only, and in other embodiments the gas supply unit 16 may be adapted to provide any other number of processing gases to the processing chamber 12, either via separate gas supply ducts or via a common gas supply duct.

In the configuration shown in FIG. 1, the gas supply unit 16 may be adapted to provide a carbon-containing precursor gas such as methane ($CH_4$) via the first gas supply duct 18a, hydrogen gas ($H_2$ gas) via the second gas supply duct 18b, and a carrier gas such as argon (Ar) via the third gas supply duct 18c. The gas supply unit 16 may be further adapted to selectively adjust a partial pressure and/or (mass or volumetric) flow rate of the carbon containing precursor gas, the hydrogen gas and the carrier gas into the processing chamber 12.

During the CVD process in the processing chamber 12, the carbon containing precursor gas may be dissociated into carbon atoms and hydrogen, such as due to thermal decomposition or plasma decomposition. The free carbon atoms are subsequently absorbed onto the surface of the copper workpiece, whereas the hydrogen may be removed from the processing chamber 12, such as by means of evacuation or vacuum pumping.

The CVD process may proceed in two subsequent phases. In a first phase (carbon nucleation phase), the metal workpiece on the sample holder 14 is exposed to a mixture of the carbon containing precursor gas and the hydrogen gas. The carbon nucleation phase serves to deposit single carbon atoms on the copper surface at randomly dispersed locations, where they may serve as seeds or anchor points.

In the first phase, the chemically active hydrogen gas may serve to reduce the copper surface and keep those parts of the surface where no carbon has settled free from oxides and other contaminants. Moreover, the hydrogen atoms may serve to remove some carbon atoms from existing graphene domains on the copper surface, such as when the carbon atoms are not formed directly on the copper surface, but combine with other copper atoms or form in higher layers.

Even though the hydrogen gas may potentially lead to a slowdown of the graphene growth, the hydrogen gas may nevertheless play an important role to achieve a high quality monolayer growth. The graphene growth process may depend on a balance between carbon diffusion/deposition and hydrogen etching. An optimization of the carbon containing precursor gas/hydrogen gas ratio in the first phase may strongly affect both the nucleation density and the domain size of the carbon domains forming on the surface of the metal workpiece.

The first phase may have a duration in the range of 10 minutes to 60 minutes, in particular 20 minutes to 40 minutes, such as 30 minutes.

In a subsequent second phase (growth phase), graphene is grown epitaxially on the metal surface by using methane as the carbon source. The absorbed carbon atoms group around the carbon seeds formed in the first phase, and may form a hexagonal monolayer graphene structure.

In the second phase, it may be advantageous to choose a lower flow rate of the carbon containing precursor gas as compared with the first phase. Under the reduced flow conditions, the carbon atoms can are absorbed onto the copper surface in the desired hexagonal monolayer structure, whereas higher flow rates could potentially lead to unstructured growth in a plurality of layers. The hydrogen gas flow in the second phase may again serve to edge away excess carbon atoms that do not form in the hexagonal structure. However, the hydrogen gas flow rate in the second phase is likewise reduced as compared to the first phase, so as to increase the net carbon growth rate.

The second phase may have a duration of 30 minutes to 120 minutes, in particular 50 minutes to 70 minutes, such as 60 minutes.

Argon may be added as a carrier gas in the second phase, so to increase the total gas pressure in the processing chamber 12 as compared with the first phase. A decrease in the exhausting power of the vacuum pump in the second phase as compared to the first phase may contribute to the increase of the total gas pressure.

The total gas pressure in the processing chamber may significantly affect the efficiency and quality of the CVD process, both during the first phase and the second phase. Relatively low-pressure CVD can ensure the formation of a uniform monolayer graphene film. A comparatively low pressure, in particular in combination with comparatively low gas flow rates may result in fewer collisions between the gas molecules and a higher absorption rate of carbon on the copper surface, in particular during the carbon nucleation phase. On the other hand, at a too low pressure, the growth rate of graphene may be very slow due to insufficient carbon supply, and the graphene domains may hardly merge into a homogeneous film.

In order to control the deposition of the seed carbon atoms and avoid the formation of multiple carbon layers on the copper, the first phase may be run at a comparatively low total pressure in the range of 1 to 3 Torr, such as 2 Torr, but comparatively high partial flow rates of the carbon containing precursor gas and the hydrogen gas, such as 0.5 standard cubic centimeters per minute (sccm) to 2.0 sccm for methane and 100 sccm to 200 sccm for hydrogen gas. No carrier gas is provided in the first phase, in this embodiment.

In the second phase, the total gas pressure may be increased to a range of 20 Torr to 40 Torr, such as 30 Torr, such as by addition of the carrier gas flow and/or a decrease of the exhausting power. At the same time, the methane gas flow rate may be reduced to 0.1 sccm to 0.5 sccm, and the hydrogen gas flow rate may be reduced to 10 sccm to 30 sccm. The argon carrier gas may be provided at gas flow rate of 20 sccm to 100 sccm in the second phase.

Figure 2A:
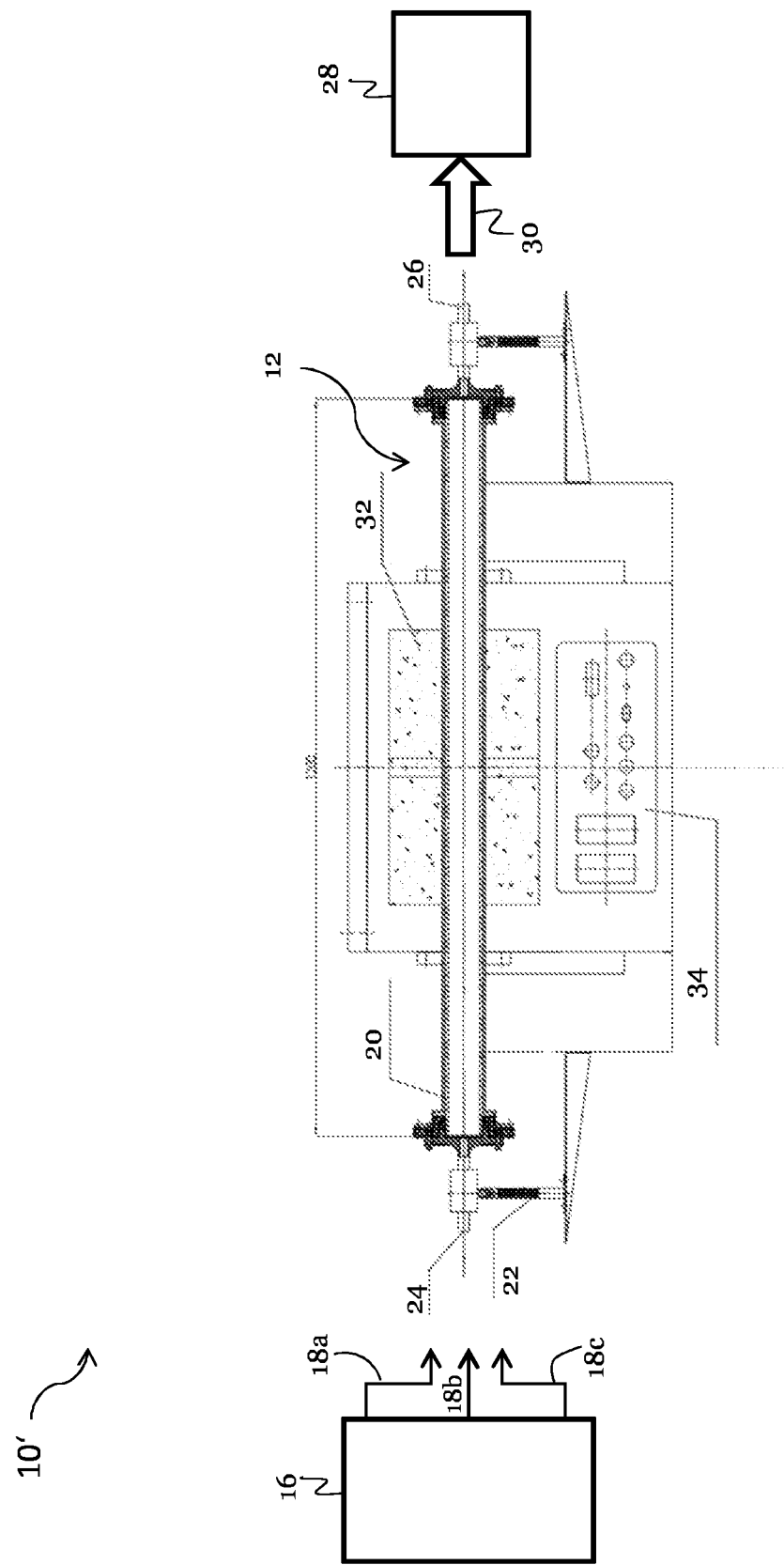
FIG. 2a is a schematic illustration of another system for coating a metal workpiece with graphene according to an embodiment of the present disclosure.

FIG. 2a is a schematic illustration of a CVD coating system 10' according to another embodiment. The CVD coating system 10' is generally similar to the system 10 described above with reference to FIG. 1, and corresponding elements share the same reference numerals.

In the configuration of FIG. 2a, the processing chamber 12 comprises a quartz tube 20, such as a cylinder tube having a length of 1200 mm and a diameter of 120 mm. The processing chamber 12 is supported by a frame unit 22 that holds the quartz tube 20 in place at opposite ends of the quartz tube 20.

At its first end (left-hand side in FIG. 2a), the quartz tube 20 is sealed by means of an inlet gas seal 24 of the processing chamber 12, which is in fluid connection with the gas supply unit 16 via the gas supply ducts 18a, 18b, 18c. As described above with reference to FIG. 1, the gas supply unit 16 may selectively provide the carbon-containing precursor gas, the hydrogen gas and the carrier gas to the processing chamber 12 at the predetermined flow rates.

At its second end (right-hand side in FIG. 2a) opposite to the first end, the quartz tube 20 may be sealed by means of an outlet gas seal 26, which is in fluid communication with a vacuum pump unit 28 via an evacuation duct 30.

The vacuum pump unit 28 may be adapted to adjust a total gas pressure in the quartz tube 20, such as a predetermined sub-atmospheric pressure. For instance, the vacuum pump unit 28 may be adapted to evacuate the quartz tube 20 in the first phase at a first exhausting power, and to evacuate the quartz tube 20 in the second phase at a second exhausting power that is smaller than the first exhausting power, so that a higher total gas pressure results in the quartz tube 20 in the second phase as compared to the first phase.

The lower exhausting power in the second phase further contributes to a more homogeneous gas flow in the quartz tube 20, with less perturbations and turbulences, thereby resulting in a more homogeneous graphene coating.

As further illustrated in FIG. 2a, the CVD coating system 10' additionally comprises a heating unit 32, such as a CVD furnace. In the configuration of FIG. 2a, the heating unit 32 is mounted to encase and surround the quartz tube 20 in a center portion of the quartz tube 20. The heating unit 32 may be slidably mounted relative to the frame unit 22, thereby allowing the heating unit 32 to the positioned selectively along the length of the quartz tube 20, or to be completely removed from the quartz tube 20.

The heating unit 32 may be adapted to selectively heat the interior of the quartz tube 20, comprising the metal workpiece held in the quartz tube 20, to a predetermined temperature during the first phase and/or the second phase.

In some embodiments, the temperature in the quartz tube 20 may significantly affect the growth rate and quality of the graphene coating. In particular, the ambient temperature in the quartz tube 20 may affect the catalytic dissociation of methane into unsaturated carbon/hydrogen compounds $CH_x$, x=3, 2, 1, 0, as well as the surface diffusion and adsorption of carbon atoms onto the graphene nuclei, and later graphene domains.

For instance, a temperature of approximately 1000° C., but below the melting temperature of copper (1083° C.) may provide for an efficient dissociation of the carbon containing precursor gas, and good diffusion properties of active carbon both in the first phase and in the second phase. At the same time, the high temperature decreases the nucleation density in the first phase, thereby allowing the formation of fewer but larger graphene domains. Moreover, a high temperature range contributes to a attachment of carbon species onto graphene nuclei in the second phase.

It was found that the graphene domain growth rate decreases rapidly when growth fronts of neighboring graphene domains approach each other when the CVD process is done at comparatively low temperatures below 1000° C., or at too low hydrocarbon feeding rates.

A temperature slightly below the melting temperature of the metal workpiece may further result in a so-called pre-melting (softened) surface ensuring both the mechanical smoothness and an electronically homogeneous substrate surface. In particular, the reduction of mechanical surface inhomogeneities in this temperature range may lead to a reduced nucleation density, and finally a higher quality of the graphene coating.

Proper surface polishing may likewise accelerate the graphene growth by minimizing surface roughness. For instance, unidirectional diamond polishing may improve both the formation rate of graphene growth nuclei, and the unidirectional orientation of the individual graphene domains.

The CVD coating system 10' additionally comprises a control unit 34 that is communicatively coupled to the gas supply unit 16, the vacuum pump unit 28 and the heating unit 32. Via the control unit 34, the user may selectively control the gas flow rates of the carbon-containing precursor gas, the hydrogen gas and the carrier gas provided by the gas supply unit 16, an exhausting power of the vacuum pump unit 28, and/or a heating power of the heating unit 32, both in the first phase and in the second phase.

In the examples described above with reference to FIGS. 1 and 2a, the copper surface of the workpiece may serve as a catalyst for the methane decomposition. In this context, it may be advantageous to use pre-oxidized copper, and/or to heat the workpiece in a non-reducing atmosphere prior to the actual graphene growth so as to retain a small concentration of oxygen on the copper surface. This may reduce the carbon nucleation rate and thereby trigger the formation of lesser but bigger graphene domains of higher quality.

The surface quality properties like smoothness, degree of contamination, substrate impurities and defects of the metal workpiece may have a substantial influence on the quality of the generated graphene layer. Commercially available copper foils generally have a polycrystalline structure. In some embodiments, it may be advantageous to convert the polycrystalline structure into a Cu (111) surface orientation. Because of an excellent lattice match, the graphene growth rate on Cu (111) can be much higher than on any other copper surface structure. In particular, the orientation of epitaxially grown graphene on a Cu (111) surface aligns itself automatically with the underlying copper lattice.

In some embodiments, the method may hence comprise an additional annealing step of the metal workpiece to convert the crystalline structure of the surface of the metal workpiece, in particular into a Cu (111) crystalline orientation, prior to the first phase.

For the annealing, the metal workpiece may be placed on the sample holder in the center of the quartz tube 20, and may be heated by the heating unit 32 to a temperature in the range of 1000° C. or higher, such as 1060° C., at atmospheric pressure. The annealing time may be in the range of 1 to 15 hours, such as 2 hours.

Additionally, it may be advantageous to clean the surface of the metal workpiece prior to the annealing, such as by exposing the metal workpiece to a mixture of hydrogen gas and a carrier gas supplied from the gas supply unit. For instance, hydrogen gas may be supplied at a flow rate of 50 sccm, and argon may be supplied as a carrier gas at a flow rate of 50 sccm. The cleaning may be performed at an elevated temperature in the range of 500° C. to 800° C., such as 600° C.

In order to further enhance the quality of the graphene coating, it can be beneficial to shield the quartz tube 20 against external impact and vibrations in some embodiments, as will now be described with reference to FIG. 2b.

Figure 2B:
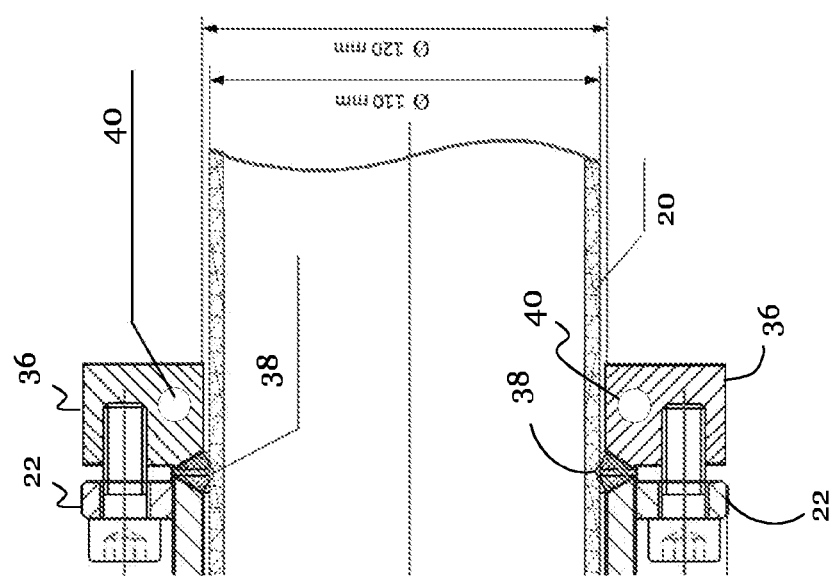
FIG. 2b is a schematic illustration of a detail of the system shown in FIG. 2a, and illustrates the use of damper elements in a system according to an embodiment.

FIG. 2b shows a detail of the quartz tube 20 of the CVD coating system 10' described above with reference to FIG. 2a, in the vicinity of its right-hand end portion.

As can be taken from FIG. 2b, the quartz tube 20 is mounted to the frame unit 22 by means of a damper element 36 that comprises a two-component o-ring 38. An inner layer of the o-ring 38 (facing the quartz tube 20) may be formed of a perfluoro elastomer that is highly temperature stable and provides good thermal insulation of the quartz tube 20 against the frame unit 22 and the outlet gas seal 26. An outer layer of the o-ring 36 (facing away from the quartz tube 20) may be formed of a vinyl methylene silicone rubber material that provides a good cushion against mechanical perturbations and vibrations.

In order to further support the cooling, cooling channels 40 may be formed in the damper element 36 to allow a flow of cooling fluid, such as water or air, through the damper element 36.

Similar damper elements may likewise be provided on the opposite (left-hand) side of the quartz tube 20, towards the inlet gas valve 24, but are not shown in the detail view of FIG. 2b.

In order to further enhance the quality of the graphene growth, guiding plates 42, 42' may be provided within the quartz tube 20 to guide the flow of the carbon-containing precursor gas, the hydrogen gas and/or the carrier gas in the quartz tube 20 and towards the sample holder 14, as will now be described with reference to FIGS. 3a to 4.

Figure 3B:
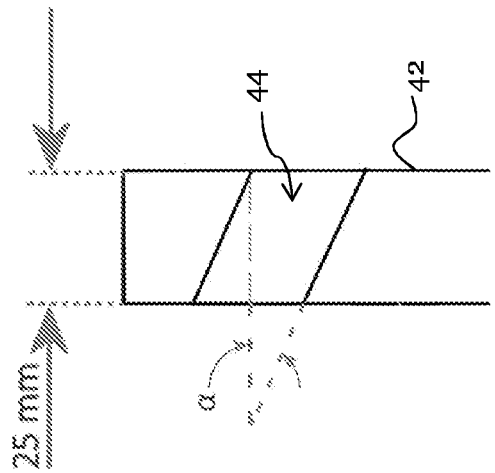
Figure 3A:
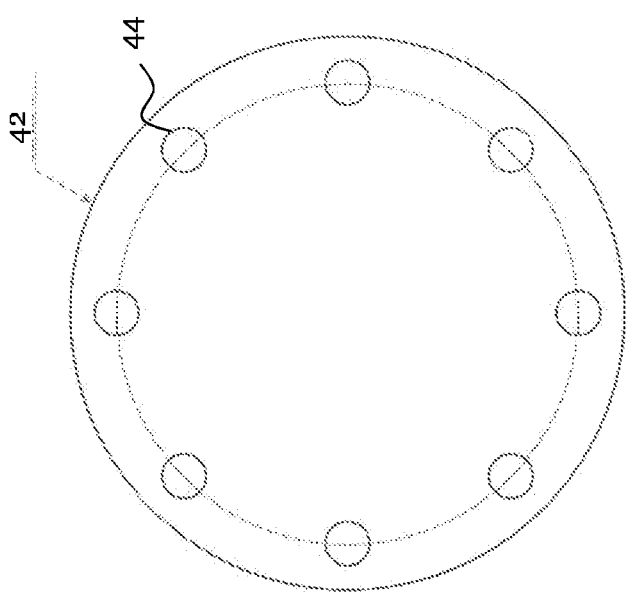
FIG. 3a is a schematic illustration of a guiding plate used in a system for coating a metal workpiece with graphene according to an embodiment of the present disclosure.

FIG. 3a shows a guiding plate 42 according to an embodiment in a front view, whereas FIG. 3b shows the same guiding plate 42 in a partial cross-sectional side view.

The guiding plate 42 shown in FIG. 3a is a baffle plate whose outer diameter roughly corresponds to an inner diameter of the quartz tube 20, so that the guiding plate 42 can be placed inside the quartz tube 20 with its surface perpendicular to a central axis of the quartz tube 20, such as in between the inlet gas seal 24 and the sample holder 14 and/or in between the sample holder 14 and the outlet gas seal 26. The guiding plate 42 hence present a barrier to the flow of the carbon containing precursor gas, the hydrogen gas and/or the argon gas towards and/or from the metal workpiece. However, a plurality of through holes 44 may be formed in the guiding plate 42 so that the carbon-containing precursor gas, the hydrogen gas and/or the argon gas may pass through the guiding plate 42 at predetermined locations, and may be focused onto the sample holder 14.

FIG. 3a shows a configuration in which eight through holes 44 are formed in the guiding plate 42 in a circular configuration, but other configurations may have a different number of through holes in a different geometric pattern.

As shown in the side view of FIG. 3b, each of the through holes 44 may be slanted with respect to a central axis of the guiding plate 42 under an inclination angle α, so as to direct a gas flow towards the center of the quartz tube 20, where the metal workpiece may rest on the sample holder 14. However, in other configurations the through holes may be straight, corresponding to α=0.

Figure 4:
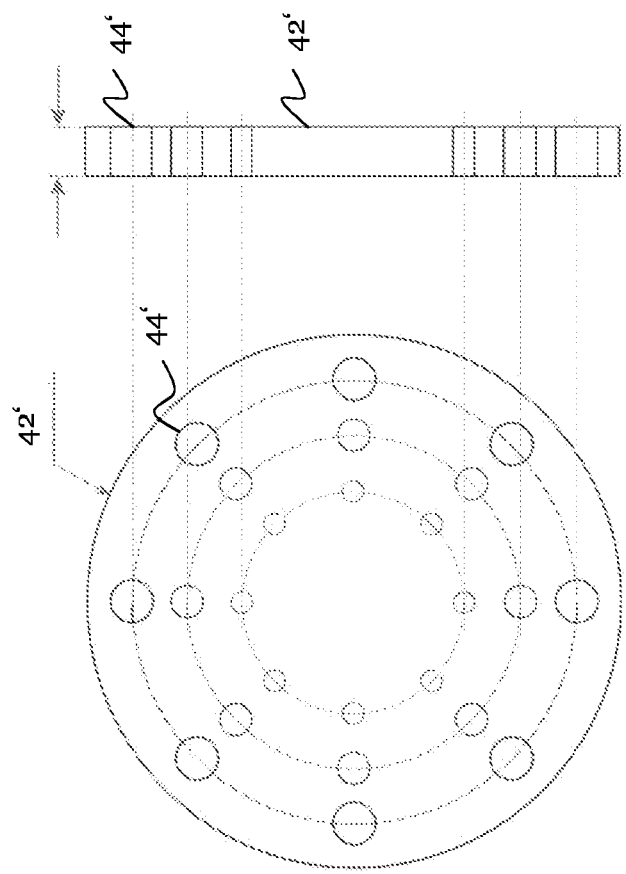
FIG. 4 is a schematic illustration of another guiding plate used in a system for coating a metal workpiece with graphene according to an embodiment of the present disclosure.

FIG. 4 shows a guiding plate 42' according to another embodiment, both in a front view (left-hand side) and in a cross-sectional side view (right-hand side).

The guiding plate 42' generally corresponds to the guiding plate 42 described above with reference to FIGS. 3a and 3b. However, the through holes 44' of the guiding plate 42' are arranged in three concentric circles, each circle comprising eight through holes 44'. A diameter of the through holes 44' decreases from the outermost circle to the middle circle to the innermost circle, as can be seen from the cross-sectional side view.

The geometry of the guiding plates 42, 42' and their through holes 44, 44' may be adapted in accordance with a geometry of the metal workpiece to be coated.

In some examples, the guiding plates 42, 42' may be formed of a metal, such as steel, and therefore may double as radiation or heat reflectors that reflect the heat of the heating unit 32 back towards the center of the quartz tube 20 where the sample holder 14 is located. This effect may contribute to a more homogeneous temperature profile within the quartz tube 20, which may enhance the quality of the graphene growth.

Figure 5:
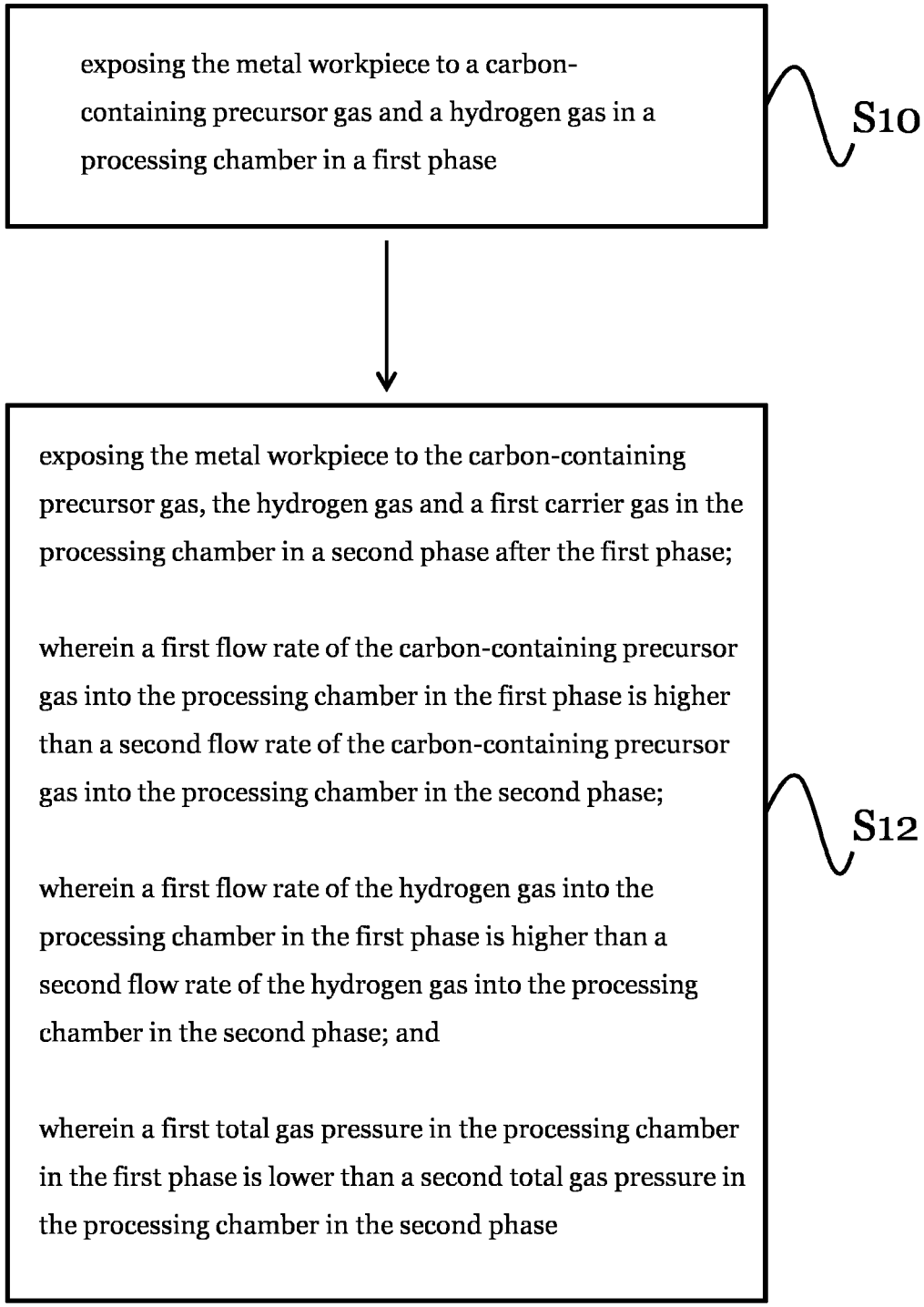
FIG. 5 is a flow diagram illustrating a method for coating a metal workpiece with graphene according to an embodiment of the present disclosure.

FIG. 5 is a flow diagram illustrating a method for coating a metal workpiece with graphene by means of chemical vapor deposition (CVD) according to an embodiment, such as in a CVD coating system 10, 10' described above with reference to FIGS. 1 to 4.

In a first phase S10, the metal workpiece is exposed to a carbon-containing precursor gas and a hydrogen gas in a processing chamber.

In a second phase S12 subsequent to the first phase S10, the metal workpiece is exposed to the carbon-containing precursor gas, the hydrogen gas and a first carrier gas.

A first flow rate of the carbon-containing precursor gas into the processing chamber in the first phase S10 is higher than a second flow rate of the carbon-containing precursor gas into the processing chamber in the second phase S12. Similarly, a first flow rate of the hydrogen gas the processing chamber in the first phase S10 is higher than a second flow rate of the hydrogen gas into the processing chamber in the second phase S12. A first total gas pressure in the processing chamber in the first phase S10 is lower than a second total pressure in the processing chamber in the second phase S12.

The techniques of the present disclosure may employ a CVD epitaxial growth process to create a homogeneous corrosion protection graphene coating on a metal surface, in particular on a copper surface. The number of the deposited graphene layers can be adjusted by controlling a duration of the CVD process.

The CVD process may provide a homogeneous graphene coating on all accessible metal surfaces, even recessed areas. Unlike previous graphene coating solutions, the techniques of the present disclosure may avoid the necessity of electrolytic and electrophoretic deposition, coupling agents, separating and transferring graphene from a precursor, or dispersion of graphene in a metal matrix.

The techniques of the present disclosure may provide a highly conductive yet mechanically stable surface coating of electrical connectors and switches, such as to protect the metal surfaces from corrosion and mechanical wear. Applications may include screw terminals, spring clamps, or insulation displacement connections.

The descriptions and the figures merely serve to illustrate the techniques of the present disclosure, but should not be understood to imply any limitation. The scope is to be determined from the appended claims.

REFERENCE SIGNS 10, 10' CVD coating system
12 processing chamber
14 sample holder
16 gas supply unit
18a, 18b, 18c gas supply ducts
20 quartz tube
22 frame unit
24 inlet gas seal of processing chamber 12
26 outlet gas seal of processing chamber 12
28 vacuum pump unit
30 evacuation duct
32 heating unit
34 control unit
36 damper element
38 o-ring
40 cooling channels
42, 42' guiding plates
44, 44' through holes in guiding plates 42, 42'

As detailed above, the chemical vapor deposition according to the first aspect may proceed in two subsequent phases. By choosing the flow rate of the carbon-containing precursor gas and the hydrogen gas in the first phase higher than in the second phase, but adjusting the first total gas pressure in the processing chamber lower in the first phase than in the second phase, the method according to the present disclosure may provide for an efficient carbon nucleation of dissociated carbon atoms on a surface of the metal workpiece in the first phase. These carbon atoms may serve as seeds or anchor points for a graphene domain growth in the second phase.

Due to the relatively lower first total gas pressure in the first phase, the carbon atoms that form on the surface of the metal workpiece in the first phase may typically form in a single layer and at segregate or separate locations across the surface, which may provide good anchor points for the graphene growth.

The hydrogen gas may serve to keep the surface of the metal workpiece free of oxides and other undesired deposits during the first phase. Additionally, the hydrogen gas may serve to remove carbon atoms that do not have the desired segregate or separate locations across the surface, but combine with other carbon atoms or form higher layers. By keeping both the first flow rate of the carbon-containing precursor gas and the first flow rate of the hydrogen gas relatively higher in the first phase, but at a low total gas pressure, a high quality carbon nucleation may be achieved.

In the subsequent second phase, the metal workpiece is exposed to the carbon-containing precursor gas, hydrogen gas and a first carrier gas at the increased second total pressure in the processing chamber. These conditions are beneficial for an efficient hexagonal graphene growth on the surface of the metal workpiece, so that the anchor points formed in the first phase may grow into monolayer domains, and may finally form a monolayer graphene coating on the metal workpiece.

By depositing the graphene on the metal workpiece in two subsequent phases with different process parameters as specified above, the techniques of the present disclosure may result in the formation of a high quality and mechanically stable single layer graphene coating, while at the same time allowing the coating to be applied with high process efficiency.

In the context of the present disclosure, the first flow rate and/or the second flow rate of the carbon-containing precursor gas and/or the hydrogen gas may relate to a mass flow rate, or may relate to a volumetric flow rate.

The mass flow rate and the volumetric flow rate may provide equivalent representations in some embodiments.

In some embodiments, other measures for the first flow rate and/or the second flow rate of the carbon-containing precursor gas and/or the hydrogen gas may be employed.

According to an embodiment, a ratio of the first flow rate and the second flow rate of the carbon-containing precursor gas is no smaller than 1.5, in particular no smaller than 2.0 or 2.5 or 3.0 or 3.5 or 4.0.

In an embodiment, a ratio of the first flow rate and the second flow rate of the carbon-containing precursor gas is no larger than 10, in particular no larger than 5.

According to an embodiment, a ratio of the first flow rate and the second flow rate of the hydrogen gas is no smaller than 1.5, in particular no smaller than 2.0 or 2.5 or 3.0 or 3.5 or 4.0.

According to an embodiment, a ratio of the first flow rate and the second flow rate of the hydrogen gas is no larger than 10, in particular no larger than 5.

In an embodiment, a ratio of the first flow rate of the hydrogen gas and the first flow rate of the carbon-containing precursor gas is no smaller than 50, in particular no smaller than 60 or 70 or 100.

Similarly, a ratio of the second flow rate of the hydrogen gas and the second flow rate of the carbon-containing precursor gas may be no smaller than 50, in particular no smaller than 60 or 70 or 100, in some embodiments.

A CVD performed at these parameter ratios may, in some embodiments, lead to a particular efficient carbon nucleation in the first phase, and/or to a particularly efficient coating in the second phase.

According to an embodiment, the first carrier gas is not fed into the processing chamber in the first phase. In particular, in some embodiments no carrier gas is fed into the processing chamber in the first phase.

By limiting the influx of carrier gas to the second phase, the total gas pressure in the first phase may be kept low, thereby ensuring a high quality carbon nucleation. In the second phase, the carrier gas may lead to a relatively higher total gas pressure, which may foster an effective and fast formation of the graphene coating.

According to an embodiment, in the second phase a ratio of a flow rate of the first carrier gas to the second flow rate of the carbon-containing precursor gas is no smaller than 50, in particular no smaller than 60 or 70 or 100.

In an embodiment, in the second phase a ratio of a flow rate of the first carrier gas to the second flow rate of the hydrogen gas is no smaller than 1.5, in particular no smaller than 2.0 or 2.5 or 3.0.

The first total gas pressure in the first phase and/or second total gas pressure in the second phase may be sub-atmospheric pressures.

In an embodiment, the method may further comprise evacuating the processing chamber to the first total gas pressure in the first phase, and/or evacuating the processing chamber to the second total gas pressure in the second phase.

According to an embodiment, the first total gas pressure is no larger than 10 Torr, in particular no larger than 5 Torr or 3 Torr.

According to an embodiment, the second total gas pressure is no smaller than 15 Torr, in particular no smaller than 20 Torr or 25 Torr.

In an embodiment, the second total gas pressure is no larger than 100 Torr, in particular no larger than 70 Torr or 50 Torr.

According to an embodiment, a ratio of the second total gas pressure to the first total gas pressure is no smaller than 4, and in particular no smaller than 6 or no smaller than 8.

In an embodiment, the method may further comprise evacuating the processing chamber in the first phase at a first exhausting power, and evacuating the processing chamber in the second phase at a second exhausting power, wherein the second exhausting power is smaller than the first exhausting power.

Evacuating the processing chamber at a smaller exhausting power in the second phase than in the first phase may contribute to providing a relatively higher total gas pressure in the second phase, which may foster an effective and fast coating.

Any precursor gas comprising carbon may be employed in the context of the present disclosure.

For instance, the carbon-containing precursor gas may comprise an alkane, in particular methane and/or ethane and/or propane and/or butane.

The techniques of the present disclosure may be suitable to coat a large variety of metal workpieces, which may differ widely in material, size and/or geometry.

According to an embodiment, the metal workpiece comprises copper, or may be made of copper.

Different chemical vapor deposition techniques may be employed in the context of the present disclosure.

In an embodiment, the method further comprises heating the processing chamber and/or the metal workpiece in the first phase and/or in the second phase, in particular to a temperature of no smaller than 900° C., or no smaller than 1000° C.

The high temperatures in the first phase and later in the second phase may contribute to an efficient and fast dissociation of the carbon-containing precursor gas, so that atomic carbon is formed in the processing chamber and may be deposited on the metal workpiece efficiently.

In some embodiments, the chemical vapor deposition comprises or is a plasma-enhanced chemical vapor deposition.

A plasma enhanced chemical vapor deposition may contribute to an efficient dissociation of the carbon-containing precursor gas at relatively lower temperatures and/or at higher speeds, which may be advantageous for some applications.

In an embodiment, the method comprises, prior to the first phase, a step of cleaning a surface of the metal workpiece, in particular by exposing the surface to a gas flow comprising hydrogen gas and a second carrier gas.

The cleaning step prior to the carbon deposition may enhance the quality of the graphene coating.

The second carrier gas may coincide with the first carrier gas, or may be different from the first carrier gas.

In some embodiments, the method may comprise heating the metal workpiece before and/or during the cleaning.

In particular, the metal workpiece may be heated to a temperature of no smaller than 400° C., or no smaller than 500° C., or no smaller than 600° C.

In some embodiments, the metal workpiece may be heated to a temperature of no larger than 950° C., in particular no larger than 900° C. or no larger than 800° C.

According to an embodiment the method may further comprise, prior to the first phase, annealing the metal workpiece.

The annealing may comprise converting a crystalline structure of the surface of the metal workpiece.

For instance, the surface of a copper workpiece may be converted from a polycrystalline structure to a Cu (111) crystalline surface orientation, whose lattice parameters and lattice constants are particularly suitable for an efficient deposition of hexagonal graphene.

In some embodiments, the cleaning precedes the annealing.

According to an embodiment, the annealing comprises heating the metal workpiece to a temperature of no smaller than 900° C., in particular no smaller than 1000° C.

The annealing may comprise exposing the metal workpiece to the hydrogen gas and a third carrier gas.

According to some embodiments, the third carrier gas coincides with the first carrier gas and/or the second carrier gas.

In other embodiments, the third carrier gas differs from the first carrier gas and/or the second carrier gas.

Various carrier gases may be employed in the context of the present disclosure.

According to an embodiment, the first carrier gas and/or the second carrier gas and/or the third carrier gas comprises an inert gas, in particular argon.

According to an embodiment, exposing the metal workpiece to the carbon-containing precursor gas and the hydrogen gas in the processing chamber in the first phase and/or in the second phase comprises directing the carbon-containing precursor gas and/or the hydrogen gas towards the metal workpiece by means of a guiding plate disposed in the processing chamber, in particular focusing the carbon-containing precursor gas and/or the hydrogen gas towards the metal workpiece by means of the guiding plate disposed in the processing chamber.

The guiding plate may bring about a more homogeneous flow of the carbon-containing precursor gas and/or the hydrogen gas in the vicinity of the metal workpiece, resulting in a more effective and higher quality coating. The guiding plate may be adapted to a shape and/or position of the metal workpiece in the processing chamber.

Alternatively or additionally, the guiding plate may limit a back reflection of the thermal radiation that emanates from the heating unit, thereby resulting in a more homogeneous temperature profile within the processing chamber, which may again result in a higher coating quality.

In a second aspect, the disclosure relates to a system for coating a metal workpiece with graphene by means of chemical vapor deposition, the system comprising: a processing chamber; a sample holder adapted to hold a metal workpiece in the processing chamber; and a gas supply unit in fluid communication with the processing chamber. The gas supply unit is adapted to expose the metal workpiece to a carbon-containing precursor gas and a hydrogen gas in a first phase; and is further adapted to expose the metal workpiece to the carbon-containing precursor gas, the hydrogen gas and a first carrier gas in a second phase after the first phase. A first flow rate of a flow of the carbon-containing precursor gas into the processing chamber in the first phase is higher than a second flow rate of a flow of the carbon-containing precursor gas into the processing chamber in the second phase. A first flow rate of a flow of the hydrogen gas into the processing chamber in the first phase is higher than a second flow rate of a flow of the hydrogen gas into the processing chamber in the second phase. A first total gas pressure in the processing chamber in the first phase is lower than a second total gas pressure in the processing chamber in the second phase.

The system may be adapted to implement a method with some or all of the features described above in relation to the first aspect.

In an embodiment, the system further comprises a vacuum pump unit in fluid communication with the processing chamber to evacuate the processing chamber in the first phase and/or in the second phase.

In particular, the vacuum pump unit may be adapted to evacuate the processing chamber in the first phase at a first exhausting power, and to evacuate the processing chamber in the second phase at a second exhausting power, wherein the second exhausting power is smaller than the first exhausting power.

In an embodiment, the system further comprises a heating unit adapted to heat the processing chamber and/or the metal workpiece in the processing chamber.

The heating unit may be adapted to heat the processing chamber and/or the metal workpiece in the processing chamber in different temperature ranges in the first phase and/or in the second phase, as well as prior to the first phase and/or subsequent to the second phase.

According to an embodiment, the heating unit may be adapted to heat the processing chamber and/or the metal workpiece in the processing chamber in the first phase and/or in the second phase, in particular to temperature of no smaller than 900° C., or no smaller than 1000° C.

According to an embodiment, the heating unit is adapted to anneal the metal workpiece prior to the first phase, in particular at a temperature of no smaller than 900° C., or no smaller than 1000° C.

According to an embodiment, the heating unit may be slidably mounted relative to the processing chamber.

A slidably mounted heating unit may permit to selectively add or remove the heating power, or selectively provide heating in different zones of the processing chamber.

Any unit adapted to selectively supply a plurality of gases into the processing chamber can be employed as a gas supply unit in the context of the present disclosure. The plurality of gases may be provided from a respective plurality of gas reservoirs.

A control unit may be communicatively coupled to the gas supply unit to control the influx of the plurality of gases into the processing chamber, such as at different times and/or at different flow rates.

According to an embodiment, the gas supply unit may be adapted to expose the metal workpiece to a gas flow comprising hydrogen gas and a second carrier gas prior to the first phase, thereby cleaning the metal workpiece.

Any chamber adapted to hold the metal workpiece within may be employed as a processing chamber in the context of the present disclosure. The processing chamber is in fluid communication with the gas supply unit, so that a plurality of gases may be selectively introduced into the processing chamber at different gas flow rates.

In some embodiments, the processing chamber may be adapted to be evacuated and/or heated.

According to an embodiment, the processing chamber comprises a quartz tube.

In an embodiment, the processing chamber comprises a guiding plate adapted to direct and/or focus the carbon-containing precursor gas and/or the hydrogen gas towards the sample holder.

In particular, the guiding plate may comprise a baffle plate and a plurality of guiding openings formed in the baffle plate.

The guiding openings may be adapted to focus the carbon-containing precursor gas and/or the hydrogen gas towards the sample holder and/or the metal workpiece.

In some embodiments, the guiding openings may be straight openings.

In other embodiments, the guiding openings may be slanted relative to a surface of the baffle plate.

According to an embodiment, the guiding plate may be adapted to reflect heat and/or radiation towards the sample holder.

In an embodiment, the system further comprises a frame unit adapted to hold the processing chamber, wherein the frame unit comprises a plurality of damper elements in physical contact with the processing chamber.

The plurality of damper elements may shield the processing chamber from perturbations or vibrations during the processing, thereby resulting in a higher quality coating.

According to an embodiment, the plurality of damper elements comprise o-rings, in particular multi-component o-rings having a first component facing the processing chamber and a second component facing away from the processing chamber, the second component comprising a material different from the first component, or vice versa.

According to an embodiment, the first component has a higher heat resistance and/or thermal stability than the second component.

In an embodiment, the second component has a higher elasticity than the first component.

By utilizing the multi-component o-rings, the processing chamber may be shielded against perturbations or vibrations that could interfere with the coating process, while at the same time allowing for an efficient thermal insulation of the processing chamber against the frame and the outer environment.

In an embodiment, the plurality of damper elements may comprise cooling channels, the cooling channels allowing a cooling fluid to flow through the damper elements.

In a third aspect, the disclosure further relates to a computer program or to a computer program product comprising computer-readable instructions such that the computer-readable instructions, when read on a computer coupled to a system with some or all of the features described above, implement on the system a method with some or all of the features described above.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for coating a metal workpiece with graphene by means of chemical vapor deposition, comprising:
   exposing the metal workpiece to a carbon-containing precursor gas and a hydrogen gas in a processing chamber in a first phase; and
   exposing the metal workpiece to the carbon-containing precursor gas, the hydrogen gas and a first carrier gas in the processing chamber in a second phase after the first phase;
   wherein a first flow rate of the carbon-containing precursor gas into the processing chamber in the first phase is higher than a second flow rate of the carbon-containing precursor gas into the processing chamber in the second phase;
   wherein a first flow rate of the hydrogen gas into the processing chamber in the first phase is higher than a second flow rate of the hydrogen gas into the processing chamber in the second phase; and
   wherein a first total gas pressure in the processing chamber in the first phase is lower than a second total gas pressure in the processing chamber in the second phase.

2. The method according to claim 1, further comprising evacuating the processing chamber in the first phase at a first exhausting power and evacuating the processing chamber in the second phase at a second exhausting power, wherein the second exhausting power is smaller than the first exhausting power.

3. The method according to claim 1, further comprising heating the processing chamber and/or the metal workpiece in the first phase and/or in the second phase.

4. The method according to claim 3, wherein heating the processing chamber and/or the metal workpiece in the first phase and/or in the second phase is carried out at a temperature of no smaller than 1000° C.

5. The method according to claim 1, further comprising, prior to the first phase, cleaning a surface of the metal workpiece.

6. The method according to claim 5, further comprising, prior to the first phase, annealing the metal workpiece.

7. The method according to claim 6, wherein the cleaning precedes the annealing.

8. The method according to claim 1, wherein exposing the metal workpiece to the carbon-containing precursor gas and the hydrogen gas in the processing chamber in the first phase and/or the second phase comprises directing the carbon-containing precursor gas and/or the hydrogen gas towards the metal workpiece by means of a guiding plate disposed in the processing chamber.

9. The method according to claim 8, wherein directing the carbon-containing precursor gas and/or the hydrogen gas towards the metal workpiece comprises focusing the carbon-containing precursor gas and/or the hydrogen gas towards the metal workpiece by means of the guiding plate disposed in the processing chamber.

10. The method according to claim 3, wherein heating the processing chamber and/or the metal workpiece in the first phase and/or in the second phase is carried out at a temperature of no smaller than 900° C.

11. The method according to claim 1, further comprising, prior to the first phase, cleaning a surface of the metal workpiece by exposing the surface to a gas flow comprising hydrogen gas and a second carrier gas.

12. The method according to claim 1, wherein the depositing of the single carbon atoms is controlled and/or a formation of multiple carbon layers on the metal workpiece is prevented in the first phase based on the lower total gas pressure, the higher first flow rate of the carbon-containing precursor gas, and the higher first flow rate of the hydrogen gas.

13. The method according to claim 12, wherein the growing of the hexagonal monolayer graphene structure is epitaxial and faster than in the first phase in the second phase based on the higher second total gas pressure, the lower second flow rate of the carbon-containing precursor gas, the lower second flow rate of the hydrogen gas, and the flow rate of the first carrier gas.

14. The method according to claim 13, wherein a flow rate of the first carrier gas raises the second total gas pressure in the processing chamber in the second phase.

* * * * *